(12) United States Patent
Sui et al.

(10) Patent No.: US 11,501,667 B2
(45) Date of Patent: Nov. 15, 2022

(54) STRETCHABLE DISPLAY SUBSTRATE AND STRETCHABLE DISPLAY DEVICE

(71) Applicant: BOE Technology Group Co., Ltd., Beijing (CN)

(72) Inventors: Kai Sui, Beijing (CN); Jinxiang Xue, Beijing (CN); Zhongyuan Sun, Beijing (CN); Xiaofen Wang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 240 days.

(21) Appl. No.: 16/883,013

(22) Filed: May 26, 2020

(65) Prior Publication Data

US 2021/0049939 A1 Feb. 18, 2021

(30) Foreign Application Priority Data

Aug. 14, 2019 (CN) .......................... 201910748543.4

(51) Int. Cl.
*G09F 9/30* (2006.01)
*H01L 27/32* (2006.01)

(52) U.S. Cl.
CPC .......... *G09F 9/301* (2013.01); *H01L 27/3246* (2013.01); *H01L 27/3276* (2013.01); *H01L 2227/323* (2013.01)

(58) Field of Classification Search
CPC . G09F 9/301; H01L 27/3246; H01L 27/3276; H01L 2227/323
See application file for complete search history.

(56) References Cited

U.S. PATENT DOCUMENTS

| 11,107,792 B2* | 8/2021 | Kim ...................... G06F 1/1652 |
| 2016/0268352 A1* | 9/2016 | Hong .................. H01L 27/3218 |
| 2018/0052493 A1* | 2/2018 | Hong .................... G06F 1/1652 |
| 2020/0168824 A1* | 5/2020 | Park .................... H01L 27/3244 |

FOREIGN PATENT DOCUMENTS

| CN | 105977276 A | 9/2016 |
| CN | 107731866 A | 2/2018 |

OTHER PUBLICATIONS

First Office Action dated Apr. 27, 2021 for application No. CN201910748543.4 with English translation attached.

* cited by examiner

*Primary Examiner* — Lex H Malsawma
(74) *Attorney, Agent, or Firm* — Nath, Goldberg & Meyer; Joshua B. Goldberg

(57) ABSTRACT

The present disclosure provides a stretchable display substrate and a stretchable display device. The stretchable display substrate includes a substrate having a wiring region and a display region along a first direction, the display region including a plurality of display units and a plurality of connecting units, the plurality of display units being spaced apart from each other and arranged in an array; each of the hollow structures having a first extending portion extending along a second direction, wherein the display region includes a first transition region close to the wiring region and a central region away from the wiring region, and the first length of the first extending portion of each of the hollow structures in the transition region is not greater than the first length of the first extending portion of each of the hollow structures in the central region.

12 Claims, 4 Drawing Sheets

STRETCHABLE DISPLAY SUBSTRATE AND STRETCHABLE DISPLAY DEVICE

CROSS REFERENCE TO RELATED APPLICATION

This application claims priority to Chinese patent application No. 201910748543.4, filed on Aug. 14, 2019, the entire contents of which are incorporated herein by reference.

TECHNICAL FIELD

The present disclosure relates to the field of display technology, and particularly relates to a stretchable display substrate and a stretchable display device.

BACKGROUND

As a new display device, the stretchable display panel has a high stretching ratio (can be stretched by 12 mm) and a display effect of high resolution. In fact, the stretchable display panel is designed by connecting islands (display units) and bridges (connecting units), and forming hollow structures in a display region to make it stretchable. However, since a non-display region, such as a wiring region PAD, does not have hollow structures, when a stretching ratio reaches 4%, the display panel is prone to break between the wiring region and the display region, and many metal connection lines in the wiring region may break, which may cause a failure of the display panel.

SUMMARY

In one aspect, the present disclosure provides a stretchable display substrate including:

a substrate having a wiring region and a display region along a first direction, the display region including a plurality of display units and a plurality of connecting units, the plurality of display units being spaced apart from each other and arranged in an array, and between any two adjacent display units, one connection unit is provided;

a plurality of functional layers sequentially stacked in the display region;

a plurality of hollow structures penetrating through the plurality of functional layers and the substrate, each of the plurality of hollow structures being at a center of four display units and surrounded by the four display units, each of the hollow structures having a first extending portion extending along a second direction, and the first extending portion having a first length along the second direction, wherein the first direction intersects with the second direction, and the display region includes a first transition region close to the wiring region and a central region away from the wiring region, and the first length of the first extending portion of each of the hollow structures in the transition region is not greater than the first length of the first extending portion of each of the hollow structures in the central region.

In an embodiment, the first transition region includes at least two columns of the display units in the first direction, and in the first transition region, the first lengths of the first extending portions of the hollow structures gradually decrease from a side of the first transition region close to the central region to a side of the first transition region close to the wiring region.

In an embodiment, the first transition region includes 6 to 8 columns of the display units in the first direction.

In an embodiment, in the first transition region, the first lengths of the first extending portions of the hollow structures decrease in a stepwise manner from the side of the first transition region close to the central region to the side of the first transition region close to the wiring region.

In an embodiment, the first lengths of the first extending portions of the hollow structures in the first transition region are equal to the first lengths of the first extending portions of the hollow structures in the central region; and in the first transition region, one end of the first extending portion of each of the hollow structures away from a center of the hollow structure is filled with an elastic organic layer, and second lengths of the elastic organic layers in the second direction gradually increase from a side of the first transition region close to the central region to a side of the first transition region close to the wiring region.

In an embodiment, each of the hollow structures further includes a second extending portion extending along the first direction, and third lengths of the second extending portions of the hollow structures in the display region along the first direction are equal to each other.

In an embodiment, the substrate further includes a fixing region at a side of the display region away from the wiring region, and the display region further includes a second transition region close to the fixing region, and the first length of the first extending portion of each of the hollow structures in the second transition region is not greater than the first length of the first extending portion of each of the hollow structures in the central region.

In an embodiment, a number of columns of display units in the second transition region is equal to a number of columns of display units in the first transition region.

In an embodiment, in the second transition region, the first lengths of the first extending portions of the hollow structures gradually decrease from a side of the second transition region close to the central region to a side of the second transition region close to the fixing region.

In an embodiment, the first lengths of the first extending portions of the hollow structures in the first transition region and the second transition region are equal to the first lengths of the first extending portions of the hollow structures in the central region, one end of the first extending portion of each of the hollow structures in the first transition region and the second transition region away from a center of the hollow structure is filled with an elastic organic layer, in the second transition region, second lengths of the elastic organic layers in the second direction gradually increase from the side of the second transition region close to the central region to the side of the second transition region close to the fixing region, and in the first transition region, the second lengths of the elastic organic layers in the second direction gradually increase from a side of the first transition region close to the central region to a side of the first transition region close to the wiring region.

In an embodiment, the elastic organic layer includes at least one of polydimethylsiloxane (PDMS), polyethylene naphthalate (PEN), polyimide (PI), polyetherimide (PEI), polyethylene terephthalate (PET), polyphenylene sulfide (PPS), epoxy, polymethylmethacrylate (PMMA).

In an embodiment, each of the hollow structures includes two second extending portions extending opposite to each other in the first direction, two first extending portions extending opposite to each other in the second direction, and a central portion at an intersection of the two first extending portions and the two second extending portions.

In an embodiment, a distance between the two first extending portions in the first direction is equal to a length of the central portion in the first direction, and a distance between the two second extending portions in the second direction is equal to a width of the central portion in the second direction.

In an embodiment, in each of the display units, in each of the display units, the plurality of functional layers include:
   a buffer layer on the substrate;
   a thin film transistor and an inorganic layer on the buffer layer;
   an anode on surfaces of the thin film transistor and a part of the inorganic layer away from the substrate,
   a light emitting layer and a pixel defining layer on the anode, the pixel defining layer defining the light emitting layer as a plurality of light emitting layers spaced apart from each other;
   a cathode on the light emitting layer and the pixel defining layer; and
   a wall on a surface of the inorganic layer away from the substrate and at an edge of each of the display units close to a respective one of the hollow structures.

In a second aspect of the present disclosure, the present disclosure provides a stretchable display device.

In an embodiment, the stretchable display device includes the stretchable display substrate described above.

BRIEF DESCRIPTION OF THE DRAWINGS

The foregoing aspects of the present disclosure are explained in the description of the embodiments with reference to the following drawings, in which.

DETAILED DESCRIPTION

The embodiments of the present disclosure are described in detail below. Those skilled in the art will understand that the following embodiments are intended to explain the present disclosure, and should not be regarded as limiting the present disclosure. Unless specifically indicated, in the following embodiments, in a case where specific techniques or conditions are not explicitly described, those skilled in the art can implement the present disclosure according to common techniques or conditions in the art or product specifications.

In one aspect, the present disclosure provides a stretchable display substrate.

Figure 1:
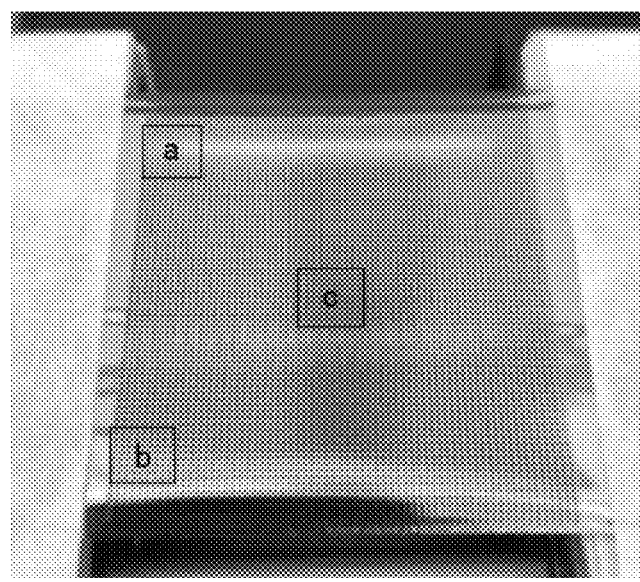
FIG. 1 is a picture of a stretchable display screen subjected to a tensile test.

A display region AA of the stretchable display substrate is designed by connecting islands (i.e., display units) and bridges (i.e., connecting units), and a non-display region such as a wiring region PAD is designed to have no hollow structures. In this case, referring to FIG. 1, tensile stress is transferred from the edge to the middle of the stretchable display substrate during stretching of the stretchable display substrate in a left-right direction. When the tensile stress is transferred to a border (regions a and b in FIG. 1) between the wiring region PAD and the display region AA, the stress difference between the wiring region PAD without the hollow structure and the display region AA with the hollow structure 230 (region c in FIG. 1) in the left-right direction is the largest, resulting in that the connecting units 220 in regions a and b are subjected to the largest tensile stress and become a stress concentration point to be most easily damaged, and breakage occurs in regions a and b when the stretching ratio reaches 4%. Furthermore, the connecting units 220 each are provided with many metal connection lines 320, which may cause failure of the display device if the connection lines are broken. According to the embodiment of the disclosure, the length of the hollow structure in the border (i.e., a transition region) of the wiring region PAD and the display region AA in a direction perpendicular to the stretching direction is changed or the hollow structure is filled with an organic layer, so that the tensile stress bearing capacity of the connecting unit of the transition region is improved, and the stretching uniformity of the stretchable display substrate is further improved.

Figure 2:
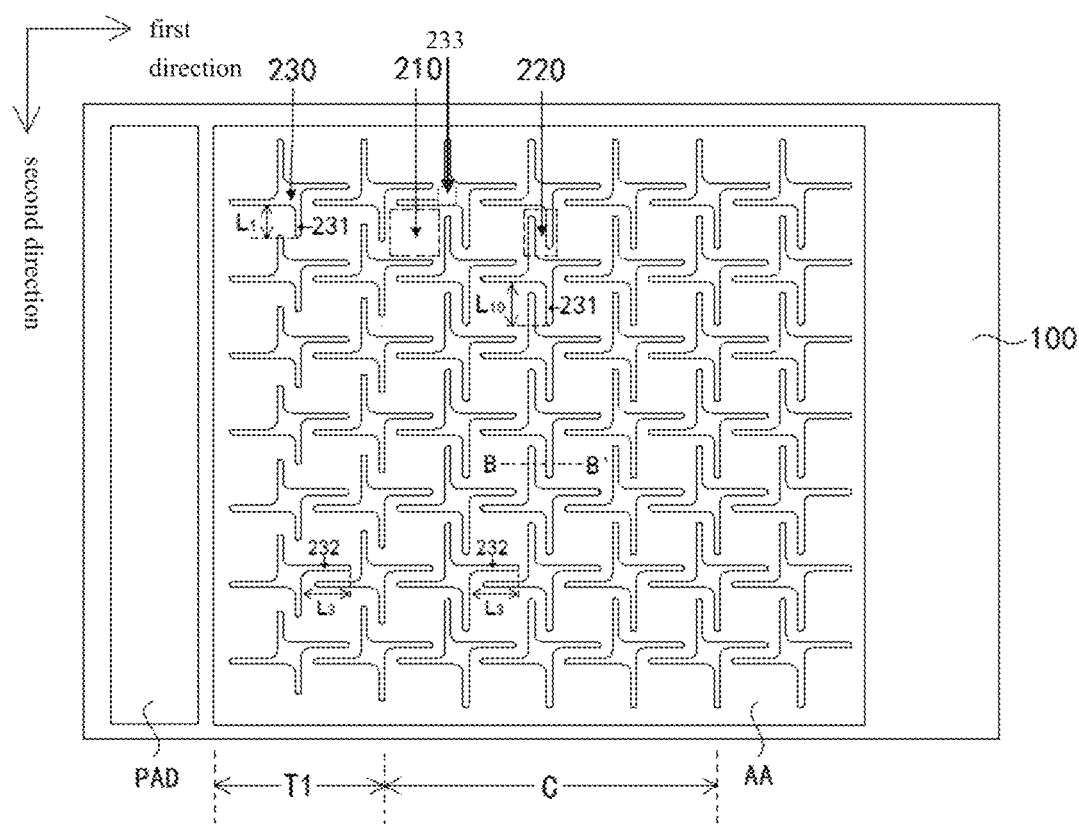
FIG. 2 is a plan view of a stretchable display substrate according to an embodiment of the present disclosure.
Figure 3:
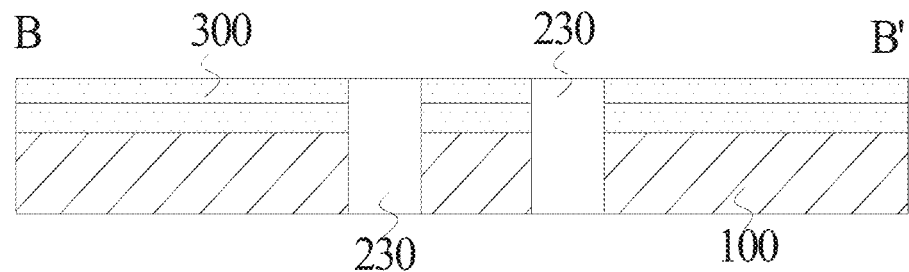
FIG. 3 is a schematic diagram of a partial cross-sectional structure taken along line B-B' in FIG. 2.

According to an embodiment of the present disclosure, referring to FIGS. 2 to 3, the stretchable display substrate includes a substrate 100, a plurality of functional layers 300, and a plurality of hollow structures 230. The substrate 100 includes a wiring region PAD and a display region AA in a first direction. The display region AA is divided into a first transition region T1 close to the wiring region PAD and a central region C away from the wiring region PAD, and includes a plurality of display units 210 and a plurality of connecting units 220. The plurality of display units 210 are spaced apart from each other and arranged in an array, and one of the plurality of connecting units 220 is between two adjacent display units 210. The plurality of functional layers 300 are sequentially stacked in the display region AA, and the plurality of hollows structures 230 penetrate through the plurality of functional layers 300 and the substrate 100. The hollow structure 230 is disposed at a center of four display units 210, that is, the hollow structure 230 is surrounded by the four display units 210 and four connecting units 220. Each hollow structure 230 has a first extending portion 231 extending along a second direction, and the first extending portion 231 has a first length along the second direction. In an embodiment, the first direction intersects with (e.g., is perpendicular to) the second direction, the first direction may represent a transverse direction or a stretching direction, and the second direction may represent a longitudinal direction. In an embodiment, the hollow structure 230 has two first extending portions 231 extending opposite to each other in the second direction. In addition, the first length $L_1$ of the first extending portion 231 of the hollow structure 230 in the first transition region T1 of the display region AA close to the wiring region PAD is not greater than the first length $L_{10}$ of the first extending portion 231 of the hollow structure 220 in the central region C of the display region AA, and the central region C is disposed at a side of the first transition region T1 away from the wiring region PAD.

In some embodiments of the present disclosure, the first transition region T1 may include at least two columns (for example, 2 to 12 columns) of display units 210 in the first direction. In the first transition region T1, the first lengths $L_1$, may gradually decrease from a side close to the central region C to a side close to the wiring region PAD. In this way, by designing the change of the first lengths $L_1$, the tensile stress bearing capacity of the connecting units 220 in the first transition region T1 can gradually increase from the side of the first transition region T1 close to the central region C to the side of the first transition region T1 close to the wiring region PAD, so as to achieve the effect of gradually releasing the tensile stress, and the tensile performance of the display substrate can be further improved.

Figure 4:
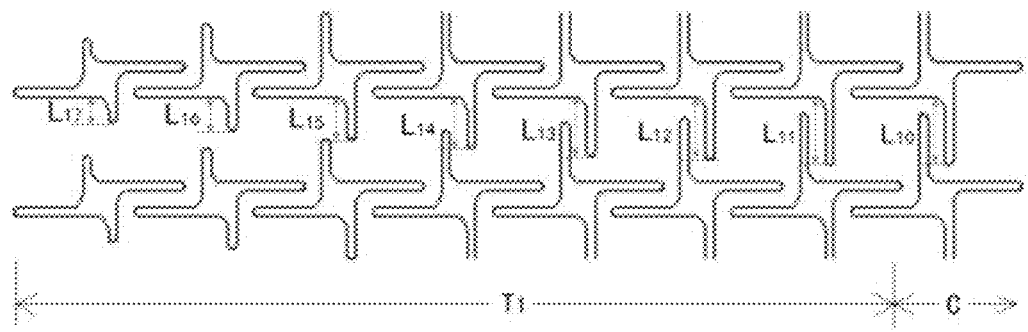
FIG. 4 is a schematic diagram showing a change in length of first extending portions in a first transition region according to an embodiment of the present disclosure.

In some examples of the present disclosure, the first transition region T1 may include 6 to 8 columns of display units 210 in the first direction, so that a multi-stage gradual release of the tensile stress can result in a lower risk of breakage of the first transition region T1 due to stretching. In some examples, the first transition region T1 may include 7 columns of display units 210 in the first direction, and referring to FIG. 4, the first lengths $L_1$ from the central region C to the first transition region T1 satisfy that $L_{10}=L_{11}>L_{12}>L_{13}>L_{14}>L_{15}>L_{16}>L_{17}$, so that the tensile strength of the connecting units 220 of the first transition region T1 gradually increases in the first direction, and the corresponding tensile stress bearing capacity gradually increases, so that the problem of excessive stress at the border between the wiring region PAD and the display region AA during stretching can be eliminated more smoothly, and the problem of breakage of the first transition region T1 during stretching can be effectively avoided. In an embodiment, for the case of $L_{10}$=320 micrometers, the stretching ratio of the display substrate can be increased to 5%-6% by setting $L_{11}$ as 320 micrometers, $L_{12}$ as 280 micrometers, $L_{13}$ as 240 micrometers, $L_{14}$ as 200 micrometers, $L_{15}$ as 160 micrometers, $L_{16}$ as 120 micrometers, and $L_{17}$ as 80 micrometers.

In other examples, the first lengths $L_1$ may also decrease in a stepwise manner from the central region C to the first transition region T1, for example, $L_{10}\approx L_{11}> L_{12}\approx L_{13}> L_{14}\approx L_{15}>L_{16}\approx L_{17}$ or $L_{10}=L_{11}>L_{12}=L_{13}>L_{14}=L_{15}>L_{16}=L_{11}$, so that two adjacent connecting units form one stress-receiving unit, and the corresponding the tensile stress bearing capacity can be higher, thereby further eliminating the problem of the excessive stress at the border between the wiring region PAD and the display region AA during stretching, and further effectively avoiding the problem of the breakage of the first transition region T1 during stretching. In an embodiment, for the case of $L_{10}$=300 micrometers, $L_{11}$, $L_{12}$, $L_{13}$, $L_1$, $L_{15}$, $L_{16}$, and $L_{17}$ may be designed as follows: $L_{11}$=300 micrometers, $L_{12}$=225 micrometers, $L_1$=225 micrometers, $L_{14}$=160 micrometers, $L_{15}$=160 micrometers, $L_{16}$=100 micrometers, $L_{17}$=100 micrometers.

Figure 5:
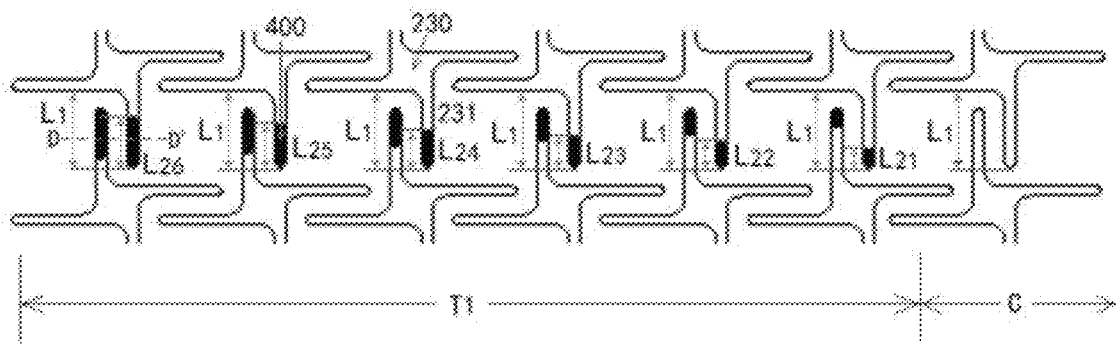
FIG. 5 is a schematic diagram showing first extending portions each filled with an elastic organic layer in a first transition region according to another embodiment of the present disclosure.

In other embodiments of the present disclosure, the first lengths $L_1$ may be equal to each other from the central region C to the first transition region T1. However, one end of the first extending portion 231 of each of the hollow structures in the first transition region T1 away from the center of the hollow structure is filled with an elastic organic layer 400, and the second lengths of the elastic organic layers 400 in the second direction gradually increase from a side of the first transition region T1 close to the central region C to a side of the first transition region T1 close to the wiring region PAD. In an embodiment, referring to FIG. 5, the first transition region T1 may include 6 columns of display units 210 in the first direction, and the first lengths of the first extending portions 321 are equal to $L_1$ from a side of the first transition region T1 close to the central region C to a side of the first transition region T1 close to the wiring region PAD, and the second lengths $L_2$ of the elastic organic layers 400 satisfy $L_{21}<L_{22}<L_{23}<L_{24}<L_{25}<L_{26}$. In this way, without changing the first lengths L1 of the hollow structures 230 in the first transition region T1, the extension lengths of the hollow portions in the second direction can be gradually decreased, as long as the second lengths of the elastic organic layers 400 gradually increase from the side of the first transition region T1 close to the central region C to the side of the first transition region T1 close to the wiring region PAD. In addition, the elastic organic layer 400 has high tensile elasticity, which can further enhance the tensile strength of the connecting unit 220.

According to an embodiment of the present disclosure, the material for forming the elastic organic layer 400 is not particularly limited as long as it has tensile elasticity, and for example, the material may be or includes at least one of a high elastic material such as polydimethylsiloxane (PDMS), polyethylene naphthalate (PEN), polyimide (PI), polyetherimide (PEI), polyethylene terephthalate (PET), polyphenylene sulfide (PPS), or a resin such as epoxy resin, polymethyl methacrylate (PMMA), or the like, which may be selected by those skilled in the art according to the requirement of the tensile property required for the display substrate.

Figure 6:
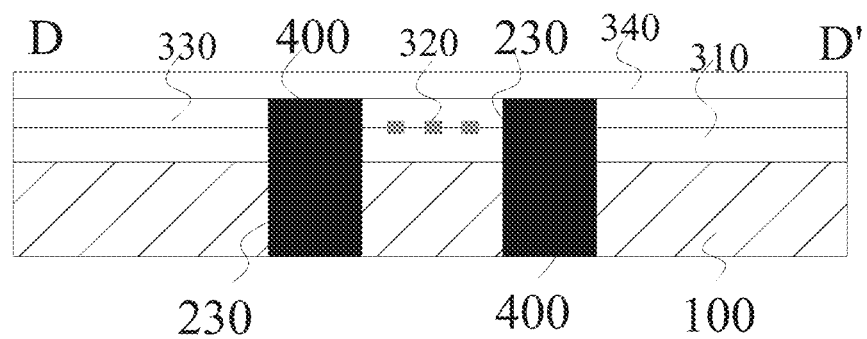
FIG. 6 is a schematic diagram of a partial cross-sectional structure taken along line D-D' in FIG. 5.

According to an embodiment of the present disclosure, referring to FIG. 6, the elastic organic layer 400 may be filled in the hollow structure 230, and the hollow structure 230 penetrates through the substrate 100, the thin film transistor 310 and the light emitting layer 330, but the hollow structure 230 does not penetrate through the encapsulation layer 340. In this way, the elastic organic layer 400 can increase the tensile strength of the connecting unit 220, thereby adequately protecting the connection metal lines 320 from being broken, and further reducing the risk of display failure of the display substrate during stretching.

According to an embodiment of the present disclosure, referring to FIG. 2, each of the hollow structures 230 further has a second extending portion 232 extending along the first direction, and third lengths L3 of the second extending portions 232 in the display region along the first direction are equal to each other, so that the stretching uniformity of the display region AA of the stretchable display substrate along the first direction can be excellent. In an embodiment, the hollow structure 230 has two second extending portions 232 extending opposite to each other along the first direction. That is, the hollow structure 230 includes two second extending portions 232 extending opposite to each other in the first direction, two first extending portions 231 extending opposite to each other in the second direction, and a central portion at an intersection of the two first extending portions 231 and the two second extending portions 232. Regardless of the widths of the first and second extending portions 231 and 232, the distance between the two first extending portions 231 in the first direction is equal to the length of the central portion 233 in the first direction, and the distance between the two second extending portions 232 in the second direction is equal to the width of the central portion 233 in the second direction.

Figure 7:
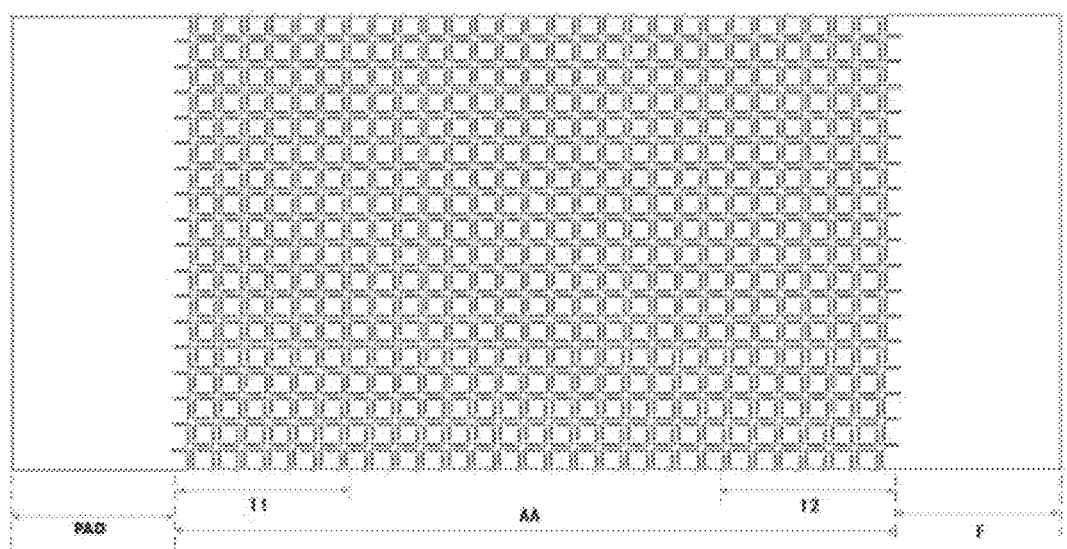
FIG. 7 is a plan view of a stretchable display substrate according to another embodiment of the present disclosure.

According to an embodiment of the present disclosure, referring to FIG. 7, a fixing region F may be further defined on the substrate 100, and the fixing region F is configured to fix respective layer structures in the display substrate. In addition, the fixing region F is at a side of the display region AA away from the wiring region PAD. The display region AA further includes a second transition region T2 adjacent to the fixing region F, and the first length $L_1'$ of the first extending portion of the hollow structure in the second transition region T2 is not greater than the first length $L_{10}$ of the first extending portion of the hollow structure in the central region of the display region AA. Therefore, the tensile strength of the second transition region T2 can be increased, so that the tensile uniformity of the stretchable display substrate is further improved, and the tensile performance of the display substrate is further improved.

In some embodiments of the present disclosure, referring to FIG. 7, the number of columns of display units 210 included in the second transition region T2 may be equal to that of columns of display units 210 included in the first transition region T1, e.g., both the first transition region T1 and the second transition region T2 include 7 columns of display units 210. In this way, the first transition region T1 and the second transition region T2 having the same width have symmetrical effect of gradual release of tensile stress in the left-right direction, thereby providing uniform stretching of the stretchable display substrate.

Figure 8:
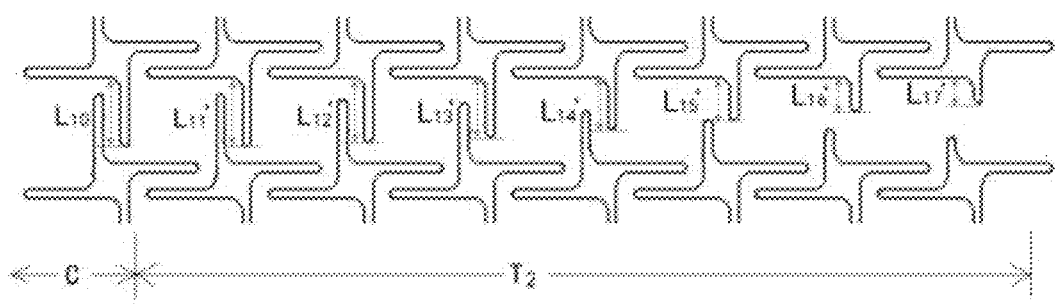
FIG. 8 is a schematic diagram showing a change in length of first extending portions in a second transition region according to another embodiment of the present disclosure.

In some examples of the present disclosure, the first lengths $L_1'$ of the second transition region T2 may gradually decrease from the side of the second transition region T2 close to the central region C to the side of the second transition region T2 close to the fixing region F. In this way, by designing the change in the first length $L_1'$, it is possible to realize a gradual increase in the tensile stress bearing capacity of the connecting units 220 in the second transition region T2 from the side of the second transition region T2 close to the central region C to the side of the second transition region T2 close to the fixing region F, thereby further achieving the effect of gradually releasing the tensile stress. In an embodiment, the second transition region T2 also includes 7 columns of display units 210, and referring to FIG. 8, the first lengths $L_1'$ from the central region C to the second transition region T2 satisfies $L_{10}=L_{11}'>L_{12}'>L_{13}'>L_{14}'>L_{15}'>L_{16}'>L_{17}'$, so that the tensile strengths of the connecting units 220 of the second transition region T2 gradually increase from the side of the second transition region T2 close to the central region C to the side of the second transition region T2 close to the fixing region F, and the corresponding tensile stress bearing capacity gradually increases, thereby moderately eliminating the problem of the excessive stress at the border between the fixing region F and the display region AA when stretching.

Figure 9:
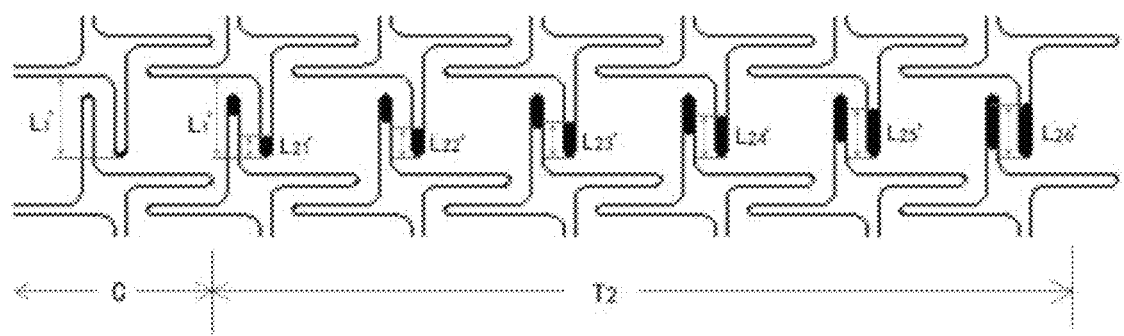
FIG. 9 is a schematic diagram showing first extending portions each filled with an elastic organic layer in a second transition region according to another embodiment of the present disclosure.

In other examples of the present disclosure, the first lengths $L_1$ in the first transition region T1 and the first lengths $L_1'$ in the second transition region T2 are both equal to the first lengths $L_{10}$ in the central region C, and the end of the first extending portion 231 of each of the first transition region T1 and the second transition region T2 away from the center of the hollow structure 230 is filled with the elastic organic layer 400. In addition, in the first transition region T1, the second lengths $L_2$ of the elastic organic layers 400 in the second direction gradually increase from a side of the first transition region T1 close to the central region C to a side of the first transition region T1 close to the wiring region PAD, and in the second transition region T2, the second lengths $L_2'$ of the elastic organic layers 400 in the second direction gradually increase from a side of the second transition region T2 close to the central region C to a side of the second transition region T2 close to the fixing region F. In an embodiment, referring to FIG. 9, the second transition region T2 also includes 6 columns of display units 210 in the first direction, and from the central region C to the second transition region T2, the first lengths of the first extending portions 321 are equal to $L_1'$, and in the second transition region T2, the second lengths $L_2'$ of the elastic organic layers 400 satisfy $L_{21}'<L_{22}'<L_{23}'<L_{24}'<L_{25}'<L_{26}'$. In this way, without changing the first lengths of the hollow structures 230 in the transition region, the extension lengths of the hollow portions in the second direction can be gradually decreased as long as the second lengths of the elastic organic layers 400 gradually increase from the side of the second transition region T2 close to the central region C to the side of the second transition region T2 close to the fixing region F. In addition, the elastic organic layer 400 has high tensile elasticity, which can further enhance the tensile strength of the connecting units 220 in the transition region.

Figure 10:
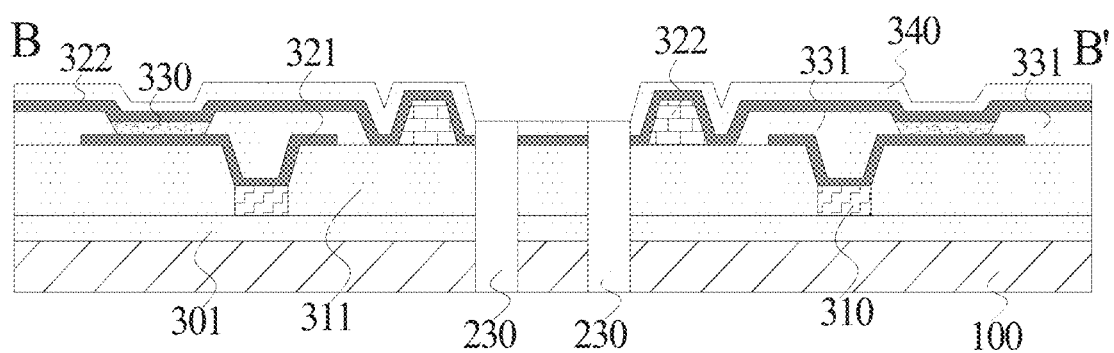
FIG. 10 is a schematic diagram of another partial cross-sectional structure taken along line B-B' in FIG. 2.

According to an embodiment of the present disclosure, the specific arrangement and selection of the plurality of functional layers 300 may be designed accordingly by those skilled in the art according to the actual display function of the display substrate. In some embodiments of the present disclosure, referring to FIG. 10, a buffer layer 301 is disposed between the thin film transistor 310 and the substrate 100, an inorganic layer 311 covers a part of the buffer layer 301 and the thin film transistor 310, the anode 321 is disposed on surfaces of the thin film transistor 310 and a part of the inorganic layer 311 away from the substrate, a pixel defining layer 331 covers a part of the anode 321, the light emitting layer 330 is disposed on a surface of the anode 321 away from the substrate 100, and a wall 332 is disposed on a surface of the inorganic layer 311 away from the substrate 100 and on an edge of the display unit close to the hollow structure for protecting the display unit when forming the hollow structures by laser cutting. A cathode 322 covers the light emitting layer 330, the pixel defining layer 331, the wall 332 and the inorganic layer 311, and the encapsulation layer 340 completely covers the cathode 322. In an embodiment, one display unit may include a plurality of light emitting layers 330 spaced apart from each other by a plurality of pixel defining layers 331. In addition, the hollow structure 230 penetrates through the substrate 100, the buffer layer 310, the inorganic layer 311, and the cathode 322. The hollow structure 230 may also penetrate through the encapsulation layer 340, and the hollow structure 230 may be formed by etching or laser cutting. Thus, an OLED structure with relatively complete structure and function can be obtained.

In summary, according to embodiments of the disclosure, the disclosure provides a stretchable display substrate, a length of a first extending portion, in a direction perpendicular to a stretching direction, of a hollow structure in a first transition region of a display region close to a wiring region is not greater than a length of a first extending portion, in the direction perpendicular to the stretching direction, of the hollow structure in a central region of the display region. In an embodiment, the first lengths of the first extending portions of the hollow structures in the first transition region increase as being away from the wiring region. Therefore, the tensile strength of the first transition region can be increased, the risk of tensile fracture of the first transition region is reduced, and the tensile uniformity of the stretchable display substrate is excellent.

In another aspect, the present disclosure provides a stretchable display device. According to an embodiment of the present disclosure, the stretchable display device includes the stretchable display substrate described above.

According to an embodiment of the present disclosure, the specific type of the stretchable display device is not particularly limited. For example, the stretchable display device may be a display screen, a mobile phone, a tablet computer, a smart watch, and the like, and those skilled in the art may correspondingly select the stretchable display device according to the actual use requirement of the display device, and details are not described herein. It should be noted that, besides the display substrate, the display device further includes other necessary components and structures. In a case where the stretchable display device is a display screen, the stretchable display device may further include a housing, a control circuit board and a power line, etc., and those skilled in the art may add other structures according to the functions of the display device, and details are not described herein.

In summary, according to the embodiments of the present disclosure, the present disclosure provides a stretchable display device, which has a stretchable display substrate having good stretching performance, thereby improving the stretching ratio and reliability of the stretchable display device. It will be appreciated by those skilled in the art that the features and advantages described above for the stretchable display substrate are still applicable to the stretchable display device and will not be described herein again.

In the description of the present disclosure, it should be understood that the orientation and position relationships indicated by the terms "central", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", and the like are based on those shown in the drawings for convenience in describing the disclosure and to simplify the description, but are not intended to indicate or imply that the device or element so referred to must have a particular orientation, be constructed and operated in a particular orientation, and are not to be construed as limiting the disclosure.

Furthermore, the terms "first" and "second" are used for descriptive purposes only and are not to be construed as indicating or implying relative importance or to implicitly indicate the number of technical features indicated. Thus, a feature defined by "first" or "second" may explicitly or implicitly include at least one of the features. In the description of the present disclosure, "plurality" means at least two, e.g., two, three, etc., unless explicitly defined otherwise.

In the description of the present specification, the description with reference to the term "an embodiment," "some embodiments," "an example," "a specific example," or "some examples" or the like means that a particular feature, structure, material, or characteristic described in connection with the embodiment or example is included in at least one embodiment or example of the present disclosure. In the present specification, the schematic representations of the terms used above are not necessarily intended to refer to the same embodiment or example. Furthermore, the particular features, structures, materials, or characteristics described may be combined in any suitable manner in any one or more embodiments or examples. Moreover, various embodiments or examples and features of various embodiments or examples described in the present specification can be combined by one skilled in the art without being mutually inconsistent.

Although the embodiments according to the present disclosure are described above, it should be understood that these embodiments are illustrative and not intended to limit the present disclosure. Those skilled in the art can make several variations, changes, replacement, and modifications without departing from the scope of the present disclosure.

What is claimed is:

1. A stretchable display substrate, comprising:
a substrate having a wiring region and a display region along a first direction, the display region comprising a plurality of display units and a plurality of connecting units, the plurality of display units being spaced apart from each other and arranged in an array, and between any two adjacent display units, one connection unit is provided;
a plurality of functional layers sequentially stacked in the display region;
a plurality of hollow structures penetrating through the plurality of functional layers and the substrate, each of the plurality of hollow structures being at a center of four display units and surrounded by the four display units, each of the hollow structures having a first extending portion extending along a second direction, and the first extending portion having a first length along the second direction,
wherein the first direction intersects with the second direction, and
the display region comprises a first transition region close to the wiring region and a central region away from the wiring region, and the first length of the first extending portion of each of the hollow structures in the first transition region is equal to the first length of the first extending portion of each of the hollow structures in the central region, and
in the first transition region, one end of the first extending portion of each of the hollow structures away from a center of the hollow structure is filled with an elastic organic layer, and second lengths of the elastic organic layers in the second direction gradually increase from a side of the first transition region close to the central region to a side of the first transition region close to the wiring region.

2. The stretchable display substrate of claim 1, wherein the first transition region comprises 6 to 8 columns of the display units in the first direction.

3. The stretchable display substrate of claim 1, wherein each of the hollow structures further comprises a second extending portion extending along the first direction, and third lengths of the second extending portions of the hollow structures in the display region along the first direction are equal to each other.

4. The stretchable display substrate of claim 1, wherein the substrate further comprises a fixing region at a side of the display region away from the wiring region, and
the display region further comprises a second transition region close to the fixing region, and the first length of the first extending portion of each of the hollow structures in the second transition region is not greater than the first length of the first extending portion of each of the hollow structures in the central region.

5. The stretchable display substrate of claim 4, wherein a number of columns of display units in the second transition region is equal to a number of columns of display units in the first transition region.

6. The stretchable display substrate of claim 5, wherein in the second transition region, the first lengths of the first extending portions of the hollow structures gradually decrease from a side of the second transition region close to the central region to a side of the second transition region close to the fixing region.

7. The stretchable display substrate of claim 5, wherein
the first lengths of the first extending portions of the hollow structures in the second transition region are equal to the first lengths of the first extending portions of the hollow structures in the central region,
one end of the first extending portion of each of the hollow structures in the second transition region away from a center of the hollow structure is filled with an elastic organic layer, and
in the second transition region, second lengths of the elastic organic layers in the second direction gradually increase from a side of the second transition region close to the central region to a side of the second transition region close to the fixing region.

8. The stretchable display substrate of claim 1, wherein the elastic organic layer comprises at least one of polydimethylsiloxane (PDMS), polyethylene naphthalate (PEN), polyimide (PI), polyetherimide (PEI), polyethylene terephthalate (PET), polyphenylene sulfide (PPS), epoxy, polymethylmethacrylate (PMMA).

9. The stretchable display substrate of claim 1, wherein each of the hollow structures comprises two second extending portions extending opposite to each other in the first direction, two first extending portions extending opposite to each other in the second direction, and a central portion at an intersection of the two first extending portions and the two second extending portions.

10. The stretchable display substrate of claim 9, wherein a distance between the two first extending portions in the first direction is equal to a length of the central portion in the first direction, and a distance between the two second extending portions in the second direction is equal to a width of the central portion in the second direction.

11. The stretchable display substrate of claim 1, wherein in each of the display units, the plurality of functional layers comprise:
a buffer layer on the substrate;
a thin film transistor and an inorganic layer on the buffer layer;
an anode on surfaces of the thin film transistor and a part of the inorganic layer away from the substrate,
a light emitting layer and a pixel defining layer on the anode, the pixel defining layer defining the light emitting layer as a plurality of light emitting layers spaced apart from each other;
a cathode on the light emitting layer and the pixel defining layer; and
a wall on a surface of the inorganic layer away from the substrate and at an edge of each of the display units close to a respective one of the hollow structures.

12. A stretchable display device, comprising the stretchable display substrate of claim 1.

* * * * *